United States Patent [19]

Aspect et al.

[11] Patent Number: 5,053,708

[45] Date of Patent: Oct. 1, 1991

[54] SYSTEM FOR THE OPTICAL PUMPING OF A CELL OF ATOMIC OR MOLECULAR GASES AND ITS APPLICATION TO A MAGNETOMETER

[75] Inventors: Alain Aspect, Gif Sur Yvette; Marc Himbert, Paris; Martine Doisy, Plougonvelin; Claude Weisbuch, Paris; Baudouin de Cremoux, Orsay, all of France

[73] Assignee: Thomson-CSF, Puteaux, France

[21] Appl. No.: 365,365

[22] Filed: Jun. 13, 1989

[30] Foreign Application Priority Data

Jun. 15, 1988 [FR] France ................................ 88 07995

[51] Int. Cl.$^5$ ............................................. G01R 33/26
[52] U.S. Cl. ..................................... 324/304; 324/301
[58] Field of Search ....................... 324/301, 304, 305; 372/11, 69, 70, 93, 94

[56] References Cited

U.S. PATENT DOCUMENTS

| | | | |
|---|---|---|---|
| 3,629,694 | 12/1971 | Hearn | 324/304 |
| 3,742,382 | 6/1973 | Smith | 372/32 |
| 3,835,416 | 9/1974 | Schlossberg et al. | 372/20 |
| 3,836,867 | 9/1974 | Smith et al. | 372/18 |
| 3,842,367 | 10/1974 | Schlossberg | 372/32 |
| 3,899,748 | 8/1975 | Bodlaj | 372/32 |
| 4,327,327 | 4/1982 | Greenwood et al. | 324/304 |
| 4,414,671 | 11/1983 | Wells, Jr. et al. | 372/70 |
| 4,493,086 | 1/1985 | Jain et al. | 372/70 |
| 4,525,672 | 6/1985 | Lam et al. | 324/304 |
| 4,806,864 | 2/1989 | Schearer et al. | 324/304 |

Primary Examiner—Michael J. Tokar
Attorney, Agent, or Firm—Oblon, Spivak, McClelland, Maier & Neustadt

[57] ABSTRACT

A system for the optical pumping of a cell of atomic or molecular gases comprises at least one optical cavity comprising at least one cell of atomic or molecular gases, one optical pumping wave being coupled to the optical cavity.

9 Claims, 2 Drawing Sheets

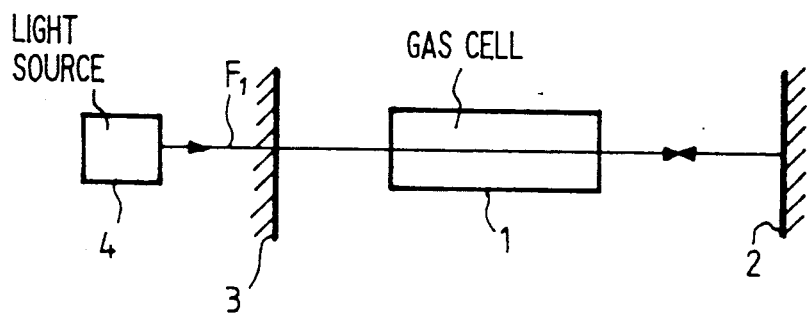
FIG_1
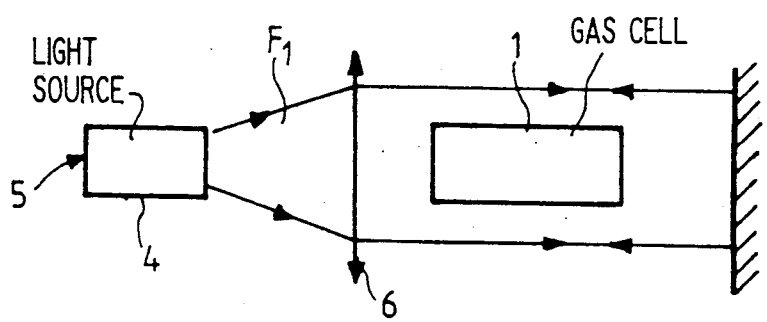
FIG_2
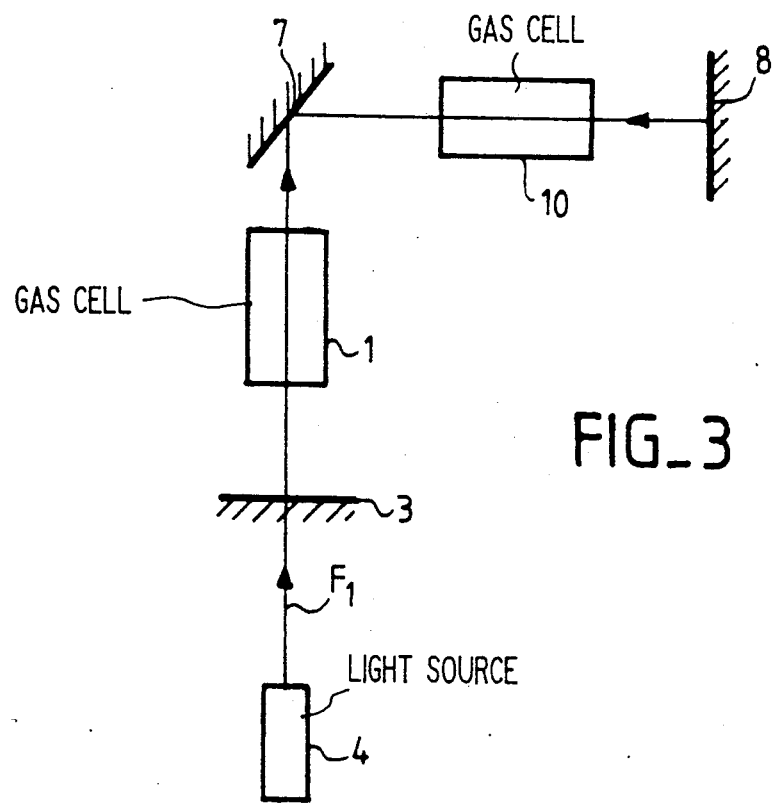
FIG_3

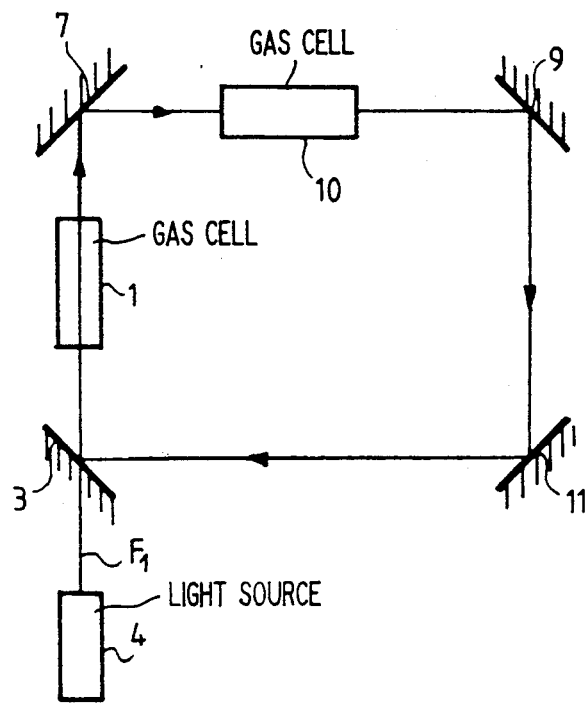
FIG_4
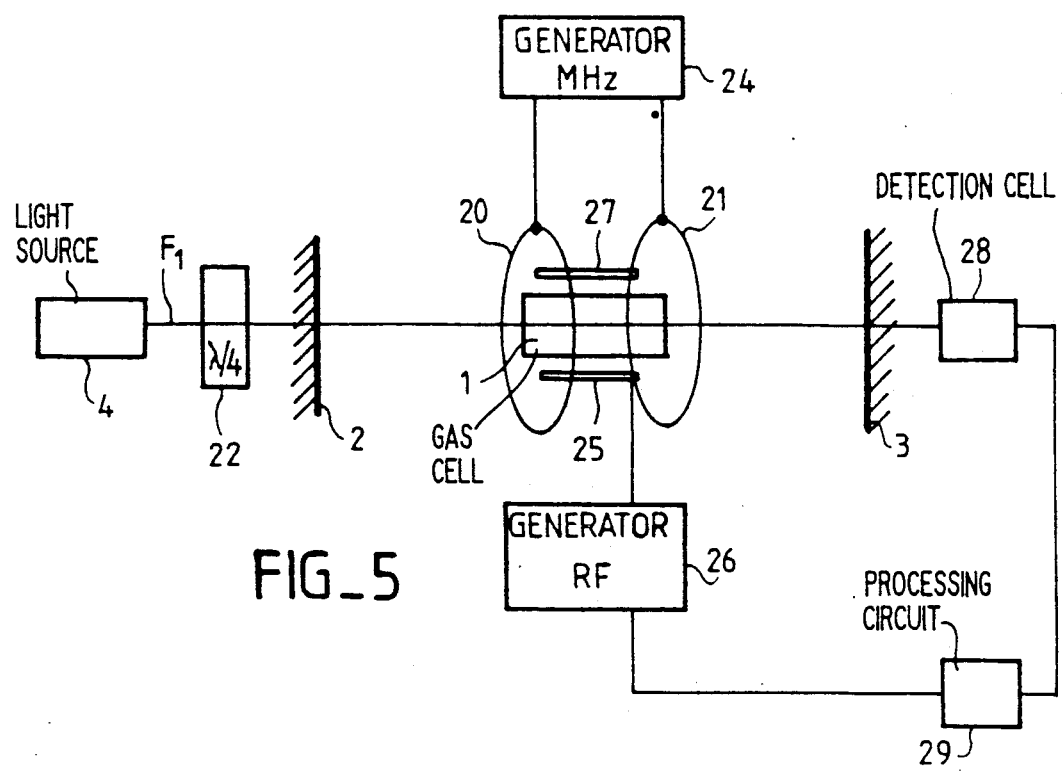
FIG_5

SYSTEM FOR THE OPTICAL PUMPING OF A CELL OF ATOMIC OR MOLECULAR GASES AND ITS APPLICATION TO A MAGNETOMETER

BACKGROUND OF THE INVENTION

1. Field of the Invention

The invention concerns a system for the optical pumping of a cell of atomic or molecular gases and its application to a magnetometer.

2. Description of the Prior Art

The excitation of cells of atomic or molecular gases such as helium, rubidium or cesium, using a monochromatic light beam, is known and has been the object of a great many applications in many devices such as magnetometers.

A description of a magnetometer using the nuclear magnetic resonance effect will be found in the article: "A Nuclear Free Precession Magnetometer using Optically Polarized $He^3$ Gas" by R.E. Slocum and B.I. Marton in IEEE, April, 1974.

The use of the optical pumping properties of helium 3 and helium 4 is now well established in the detection of weak magnetic fields. In the case of helium 4, an electrical discharge is used to create atoms in the metastable state 2S. Using a suitably polarized light, resonant towards 1.08 $\mu$m, one or more components of the transition 2S-2P are excited from this metastable state. Thus, by optical pumping, the metastable atoms are oriented or aligned in the state 2 S. When helium 3, which has a non-null nuclear spin, is used, the nuclear spin is thus oriented in the fundamental state through the hyperfine electron-nucleus interaction and the collisions exchanging the speed between atoms in the metastable state and atoms in the fundamental state.

The helium 4 magnetometer is based on the measurement of electron magnetic resonance in the magnetic field to be measured. The resonance frequency gives the value of the field to be measured. The electron resonance is detected by the variation in the absorption coefficient induced on a beam of circularly polarized light at 1.0 $\mu$m or by the variation in the polarization of fluorescence light.

The helium 3 magnetometer is based on the measurement of the nuclear magnetic resonance or the free precession of the nucleii polarized in the fundamental state. In the fundamental state, the nuclear relaxation time may be very long, greater than 24 hours, if a suitable gas cell is used. This enables separating the operations for orienting the nuclear spin and for measuring the precession frequency of these oriented spins. The measuring operation can thus be performed continuously, or repeated at regular intervals without it being necessary to orient the nucleii.

These magnetometers work with optimum values of helium pressure of the order of 1 torr. It can be shown that the optical power needed to obtain high rates of orientation or electron or nuclear alignment is of the order of some hundreds of milliwatts in the usual geometries. The use of lasers matched to one of the transition frequencies therefore calls for relatively high power, especially if semiconductor lasers are considered as sources. Furthermore, these lasers have wide lines compared to the helium lines when they are not monomode.

An object of the present invention is a method to increase the efficiency of the pumping of atomic or molecular gas cells and notably, of helium cells, by a laser diode.

SUMMARY OF THE INVENTION

The invention therefore concerns a system for optical pumping of a cell of atomic or molecular gases, said system comprising at least one resonant optic cavity comprising at least one cell of atomic or molecular gases, one optical pumping wave being coupled to said optical cavity.

BRIEF DESCRIPTION OF THE DRAWINGS

The different objects and features of the invention will appear more clearly from the following description, given by way of example and made with reference to the appended figures, of which:

FIG. 1 shows a simplified embodiment of an optical pumping system according to the invention;

FIG. 2 shows an alternative embodiment of the system of FIG. 1;

FIG. 3 shows an embodiment, with folded cavity, of the system of the invention;

FIG. 4 shows an embodiment, with ring cavity, of a system of the invention;

FIG. 5 shows an application of the invention to a magnetometer.

DETAILED DESCRIPTION OF THE INVENTION

According to the present invention, a cell of atomic or molecular gases is placed in an optical cavity receiving an excitation light wave from a light source.

The cell, made of glass, for example of the type known by the trade name CORNING 1723, is filled with helium 3 or helium 4 or a mixture of gas comprising helium 3 or 4, which enables the pumping efficiency to be optimized.

By one of the usual methods, a part of the radiation is sent back from the cavity to the laser to couple the cavity and the laser. This can be obtained simply by sending back, to the laser, a portion of the radiation transmitted or reflected in a resonant way by the cavity, or by collimation between the laser and an external mirror (which is, in fact, a laser with an external cavity) or by any other means. This assembly provides for a certain number of effects together:

1. It enables the semiconductor laser to be converted into a longitudinal monomode laser, if it is not already one, through the coupling between the laser and the cavity. The laser effect occurs at a frequency which is very close to a resonant frequency of the cavity.

2. There is a refining of the line of the semiconductor laser through the precision of the Fabry-Perot device.

3. Finally, and above all, there is an accumulation of energy in the cavity, proportioinate to the fineness F of the cavity. The light intensity flowing in the cavity is increased by a factor of F/n. Thus, an intensity of a few hundreds of milliwatts can easily be obtained within a cavity.

FIG. 1 shows a first exemplary embodiment of the optical pumping system according to the present invention.

An atomic gases cell is placed between two mirrors 2 and 3, and receives a light wave $F_1$ given by a source 4, such as a laser. The mirrors 2 and 3 form a Fabry-Perot optical cavity at the wavelength of this light. According to the example of FIG. 1, the mirrors 2 and 3 are plane, but they may also be curved, notably pherical, surfaces. It may sometimes be necessary to adapt the transversal mode of the laser to the mode of the cavity, for example by means of a lens. It is also possible for the mirror 3 to be replaced by the output face of the source 4.

The frequency of the laser is adjusted by the length of the cavity so as to excite the helium gas optimally. A possible technique is to use a cavity which is long enough so that there is always one of its modes in each of the Doppler absorption lines of the helium. Then, the wavelength is adjusted to the maximum of the gain curve of the laser so that the transmission takes place in the mode of the cavity considered. This adjustment is done by the current of the laser or its temperature. It is also possible to use a far shorter cavity for which the length will be adjusted so that a mode coincides with the transition to be excited. The matching is measured on a fluorescence signal of helium or the absorption signal of the cell. As the case may be, it may be useful to obtain a laser emission on several well chosen lines so as to excite different transitions of the helium and thus increase the rates of electron and nuclear polarization.

The semiconductor laser is of any nature (monomode or multimode), with standard double heterostructure, or with quantum wells or with any other structure. One possible material is the $Ga_{1-x} In_x As/InP$, where the composition x is adjusted to give an emission of 1.08 µm.

The concept of excitation of an atomic gas by a semiconductor laser, improved by the use of a cavity, may be applied to other lasers for an application of this type, such as the LNA laser pumping, a helium magnetometer.

FIG. 2 shows a second exemplary embodiment of the present invention, according to which the optical cavity is formed by the face 5 of the source 4, with an optical lens 6 enabling the light beams that come from the source 4 to be collimated towards the cell 1.

According to another exemplary embodiment shown in FIG. 3, the optical cavity may be folded. For example, it may have two arms making an angle of 90 degrees. A first arm is demarcated by a first mirror 3, enabling access by the pumping beam $F_1$ and a second mirror 7 forming an angle of 45°, for example, with respect to the pumping beam. The second arm is demarcated by the second mirror 7 and a third mirror 8. Each arm may contain a cell (1, 10) of atomic gases.

FIG. 4 shows another embodiment wherein the optical cavity is ring-shaped. The pumping beam $F_1$ penetrates the cavity through a first semi-reflecting mirror 3 and the ring is set up by the mirrors 7, 9, 11 and 3. Each arm of the ring may have a cell of atomic gases such as the cells 1 and 10.

By way of example, the length of a cavity may be 20 cm, thus enabling the frequency of helium to be covered, should the gas of the cell or cells be helium.

It is also possible to use the two emitting faces of the laser so as to couple it to one or two cavities according to the diagrams derived from those described above. For example:

either the laser is placed in a single optical cavity;

or else, one of the cavities is coupled to the laser to refine it while the other is used solely for the optical pumping.

The cell or cells 1, 10, may be of different shapes. Notably, they may be spherical or cylindrical.

The optical pumping system thus described may be applied to a magnetometer.

FIG. 5 thus shows an embodiment of a helium 4 magnetometer according to the present invention. This magnetometer has a cell 1 of helium 4. The cell 1 is placed in an optical cavity consisting, for example, of two mirrors 2 and 3. The optical cavity receives a pumping beam $F_1$ from a laser source 4. The pumping beam $F_1$ is linearly polarized and a quarter wave plate 22 gives a circularly polarized pumping beam.

At the two ends of the cell located in the axis of propagation of the pump wave, two electrodes 20, 21, or excitation ring, are carried to an AC voltage by a high-frequency generator 24 giving a signal of the order of 5 MHz: this makes it possible to sustain a mild discharge needed for obtaining metastable helium atoms.

Two windings 25, 27, located in planes parallel to the direction of propagation of the pumping beam F and on either side of this beam, are powered by a radio frequency generator 26 and give a radio frequency field.

Preferably, the pumping beam $F_1$ is parallel to the direction of the magnetic field to be measured, and the radio frequency field is perpendicular to this direction.

The radio frequency generator 26 is frequency modulated around a value which is adjustable so as to induce the electron magnetic resonance of helium. The adjusting of the radio frequency field can be done from the radiation transmitted by the cell 1.

For this, a detection cell 28 receives the radiation transmitted by the cell 1 and, by means of a processing circuit 29, enables action to be taken on the radio frequency generator 26.

The working of this type of magnetometer is known in the prior art. A description thereof will be found in the French patent application No. 86 06 776.

This patent application also contains arrangements enabling greater precision to be obtained through a system of synchronous detection.

According to the present invention, the optical cavity enables its efficiency to be improved by matching the cavity with a line of the gas (helium) of the cell.

The invention can also be applied to a helium 3 magnetometer, as described in the above-mentioned patent application, in providing for the helium 3 cell to be placed in an optical cavity.

It is quite clear that the above description has been given purely by way of a non-restrictive example. Other alternative embodiments may be considered without going beyond the scope of the invention.

What is claimed is:

1. A system for the optical pumping of a cell of atomic or molecular gases, comprising:
   at least one cell of atomic or molecular gases;
   at least one resonant optical cavity containing said at least one cell of atomic or molecular gases;
   a semiconductor laser generating at least one optical pumping wave being coupled to said optical cavity;
   said optical cavity being formed between one face of said semiconductor laser and one face of a mirror.

2. An optical pumping system according to claim 1, wherein the gas of the cell is helium.

3. An optical pumping system according to claim 1, wherein the optical cavity has two mirrors.

4. An optical pumping system according to claim 3, wherein the mirrors are plane.

5. An optical pumping system according to claim 3, wherein the mirrors are curved.

6. An optical pumping system according to claim 1, comprising means enabling the optical path to be folded in the cavity.

7. An optical pumping system according to claim 1 comprising means enabling the optical path to be looped in the cavity.

8. A system for the optical pumping of a cell of atomic or molecular gases, comprising:
 at least one cell of atomic or molecular gases;
 at least one resonant optical cavity containing said at least one cell of atomic or molecular gases;
 a semiconductor laser generating two optical pumping waves being coupled to said optical cavity;
 said semiconductor laser being inside a single optical cavity.

9. A system for the optical pumping of a cell of atomic gas, comprising:
 at least one cell of atomic gas;
 at least one resonant optical cavity containing said at least one cell of atomic gas;
 a semiconductor laser generating at least one optical pumping wave being coupled to said optical cavity;
 said resonant optical cavity sending a part of said optical pumping wave to said semiconductor laser.

* * * * *